(12) United States Patent
Dedic (10) Patent No.: US 9,450,279 B2
(45) Date of Patent: Sep. 20, 2016

(54) COMPONENTS AND CIRCUITS FOR OUTPUT TERMINATION

(71) Applicant: SOCIONEXT INC., Yokohama-shi, Kanagawa (JP)

(72) Inventor: Ian Juso Dedic, Northolt Middlesex (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/473,102

(22) Filed: Aug. 29, 2014

(65) Prior Publication Data

US 2015/0070104 A1 Mar. 12, 2015

(30) Foreign Application Priority Data

Sep. 12, 2013 (EP) .................................. 13184042

(51) Int. Cl.
| | |
|---|---|
| *H01P 1/26* | (2006.01) |
| *H03H 7/38* | (2006.01) |
| *H01L 23/64* | (2006.01) |
| *H01P 11/00* | (2006.01) |
| *H05K 1/02* | (2006.01) |
| *H01P 1/22* | (2006.01) |

(52) U.S. Cl.
CPC .............. *H01P 1/268* (2013.01); *H01L 23/64* (2013.01); *H01P 1/227* (2013.01); *H01P 11/003* (2013.01); *H03H 7/383* (2013.01); *H05K 1/025* (2013.01); *H05K 1/0246* (2013.01); *H01L 2924/0002* (2013.01); *H01P 1/22* (2013.01); *H05K 1/0219* (2013.01); *H05K 2201/09727* (2013.01); *H05K 2201/09736* (2013.01)

(58) Field of Classification Search
CPC ...... H01L 23/64; H01L 29/0002; H01P 1/22; H01P 1/268; H01P 11/003; H01P 1/227; H03H 7/383; H05K 1/0246; H05K 1/0219; H05K 1/025; H05K 2201/09727; H05K 2201/09736
USPC ........... 333/22 R, 32, 33, 34, 81 A, 124, 246
See application file for complete search history.

(56) References Cited

U.S. PATENT DOCUMENTS

| | | | | |
|---|---|---|---|---|
| 3,634,789 | A | * | 1/1972 | Stuckert .................. H01P 1/227 333/238 |
| 4,588,958 | A | | 5/1986 | Katz et al. |

FOREIGN PATENT DOCUMENTS

| | | |
|---|---|---|
| EP | 0 517 187 A2 | 12/1992 |
| EP | 1 202 459 B1 | 5/2006 |
| EP | 1 292 035 B1 | 10/2006 |
| EP | 2 019 486 A1 | 1/2009 |

(Continued)

OTHER PUBLICATIONS

Extended Search Report issued in European Patent Application No. 13184042.3, dated Feb. 7, 2014, 6 pages.

*Primary Examiner* — Benny Lee
*Assistant Examiner* — Jorge Salazar, Jr.
(74) *Attorney, Agent, or Firm* — Arent Fox LLP (57) ABSTRACT

A lossy electrical-signal transmission line having first and second ends, the transmission line being configured such that: its characteristic impedance at the first end has a first value; its characteristic impedance at the second end has a second value, lower than the first value; and its series resistance measured from its first end to its second end is within a given range of the difference between said first and second values.

16 Claims, 9 Drawing Sheets

(56) References Cited

FOREIGN PATENT DOCUMENTS

| | | |
|---|---|---|
| EP | 2 019 490 A1 | 1/2009 |
| EP | 2 009 795 B1 | 6/2010 |
| EP | 2 019 427 B1 | 9/2010 |
| EP | 2 023 487 B1 | 9/2010 |
| EP | 2 023 489 B1 | 2/2011 |
| EP | 2 211 468 B1 | 7/2011 |
| EP | 2 019 487 B1 | 5/2013 |
| GB | 2 024 525 A | 1/1980 |
| GB | 2 373 654 B | 2/2005 |

* cited by examiner

FIG. 1

PRIOR ART

COMPONENTS AND CIRCUITS FOR OUTPUT TERMINATION

CROSS REFERENCE TO RELATED APPLICATIONS

This application claims priority to European Patent Application No. 13184042.3, filed Sep. 12, 2013, the disclosure of which is hereby incorporated by reference in its entirety.

TECHNICAL FIELD

The present invention relates to components and circuits for output termination, for example for use in or in connection with integrated circuitry. Such components may form part of resistive circuits, for example part of termination circuits.

BACKGROUND

Resistive circuits of the present invention may be provided at the analogue outputs of digital-to-analogue converter (DAC) circuitry to serve as termination resistors, but may also serve as resistors or termination resistors (e.g. on an IC chip or in an IC-chip package) in general. For example, it is common for integrated circuitry to have outputs which need to be terminated.

Figure 1:
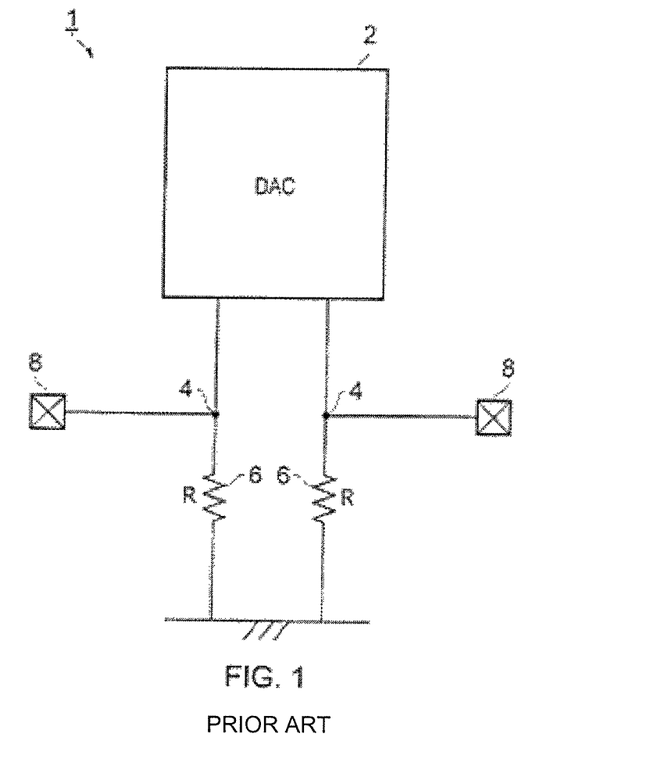
FIG. 1, as mentioned hereinabove, presents a schematic view of integrated circuitry comprising a DAC of the prior art.

By way of background, FIG. 1 presents a schematic view of integrated circuitry 1 comprising a DAC 2. The DAC 2 has two outputs 4 terminated by termination resistors 6, and connected to output terminals or pins 8 as shown. An example typical value for such termination resistors 6 is 50Ω. This typical value will be used as a running example herein for convenience.

Typically, in integrated circuitry, such termination resistors would be implemented on-chip in undoped polysilicon, and two related problems arise.

Firstly, due to process variation, one could expect a 3σ tolerance in the undoped-polysilicon resistor value of e.g. ±20%. Thus, given an ideal value of 500Ω, one might expect a value in the range 40-60Ω. This presents the problem of inaccurate termination and hence reflections—particularly, signal reflections which vary with frequency, leading to inaccuracies in frequency response and delay errors in impulse response, in other words signal waveform distortion. For example, the overall circuitry may need to meet strict scattering-parameter design specifications, e.g. $S_{11}$ (input port voltage reflection coefficient) specifications, to prevent such reflections satisfactorily. With a design requirement of e.g. >20 GHz bandwidth it is difficult to switch resistors given that such switching circuitry would present its own parasitic capacitance which badly affects $S_{11}$, and as such it is difficult to trim the resistance value without degrading $S_{11}$ at high frequencies when the impedance of the parasitic capacitance falls.

Secondly, the resistor has an associated parasitic capacitance. If, for example, the DAC output current swing were to be 10 mA to 30 mA and the two outputs were differential outputs, average current may be 20 mA for each output. This sets current rating; the resistors 6 would need around 100 μm width, with an example design specification on the undoped polysilicon resistor of around 0.2 mA/μm width. This width presents a significant parasitic capacitance which is disadvantageous as it can have a big effect on high-frequency signals as may be output by the DAC 2.

It is desirable to solve some or all of the above problems.

SUMMARY

According to a first aspect of the present invention there is provided a (lossy) electrical-signal transmission line having first and second ends, the transmission line being configured such that: its characteristic impedance at the first end has a first value; its characteristic impedance at the second end has a second value, lower than the first value; and its series resistance measured from its first end to its second end is within a given range of the difference between said first and second values.

Such a transmission line may comprise a signal conductor and one or more (ground) return paths arranged in parallel, so that the first and second ends of the line are respectively input and output terminals of the line, each between the conductor and a return path. If more than one return path is provided, they may be connected together to form a combined return path.

The difference between the first and second characteristic-impedance values may be substantial, as also may be the series resistance of the line. The line may be a lossy line in that it absorbs or dissipates half or more (or optionally a quarter or third or more) of the energy supplied to its first end by an incident input electrical signal.

The series resistance measured from the first end to the second end may be within Q percent of the difference between said first and second values, where Q is 20, or preferably 10, or more preferably 5, or more preferably less than 5 (e.g. 1, 2, 3 or 4). The series resistance measured from the first end to the second end may be substantially (i.e. in substance, or within a tolerance) equal to the difference between said first and second values.

The series resistance of the transmission line measured from the first end to each of one or a plurality of points along its length may be within a particular range of the drop in characteristic impedance from the characteristic impedance at the first end to the characteristic impedance at that point. The plurality of points may comprise all points along the length of the line.

The series resistance of the transmission line measured from its first end to the or each said point along its length may be within R percent of the drop in characteristic impedance from the characteristic impedance at the first end to the characteristic impedance at that point, where R is 20, or preferably 10, or more preferably 5, or more preferably less than 5 (e.g. 1, 2, 3 or 4). The series resistance of the transmission line measured from its first end to the or each said point along its length may be substantially equal to the drop in characteristic impedance from the characteristic impedance at the first end to the characteristic impedance at that point.

The characteristic impedance of the transmission line at a point along its length may drop monotonically as that point moves along its length from the first end to the second end. The characteristic impedance of the transmission line at a point along its length may drop linearly or in steps as that point moves along its length from the first end to the second end.

The series resistance of the transmission line as measured from the first end to a point along its length may increase linearly as that point moves along its length from the first end to the second end. Other curves of resistance increase would of course be possible, governed by the physical properties of the signal conductor of the line (resistivity, length, cross-sectional area).

The second value of characteristic impedance may be S times the first value or smaller, where S is 0.9, or preferably 0.7, or more preferably 0.5, or more preferably 0.25, or less. For example, values of S under 0.25 could be used in particular embodiments, where almost all incident energy is absorbed along the length of the line (given the corresponding series resistance). The value of S might be as low as 0.08, or 0.06 or 0.04 or 0.02.

The series resistance measured from the first end to the second end may be large enough such that half or more of the energy of a signal input at the first end would be dissipated or absorbed in the transmission line.

The transmission line may comprise a (signal) conductor and one or more separate ground or return paths (e.g. ground planes). The series resistance of the line may be considered as being the series resistance of the (signal) conductor. The conductor may be for carrying a signal, and the or each ground bath may be for connection to a reference voltage (e.g. ground) supply.

At least part of the conductor may be straight along its length. At least part of the conductor may be curved along its length. The conductor may be substantially straight along its length.

The series resistance of the transmission line may be configured by way of the electrical resistivity and the cross-sectional area of the conductor along its length. The conductor may be made of the same material along its length. The conductor may have a rectangular cross-section at least at said first and second ends. The conductor may have a rectangular cross-section along some or all of its length. The conductor may have a substantially constant cross-sectional area along some or all of its length.

The conductor may have a width and a thickness, defined along the transmission line perpendicularly to one another and perpendicularly to the length of the transmission line, and wherein the conductor may have a substantially constant width and/or thickness along some or all of its length.

The conductor may be in the form of a strip having a width and a thickness and be provided in at least one first plane (i.e. it may have parallel-connected sections occupying different planes). Such a ground path may be provided in one or more second planes (i.e. it may also have parallel-connected sections occupying different planes) parallel to the at least one first plane. The conductor may be separated from that ground path by a dielectric substrate.

The characteristic impedance of the transmission line along its length may be configured by varying along its length one or more of: the width and/or thickness of the conductor; the relative dielectric constant of the dielectric substrate; and the thickness of the dielectric substrate or the distance between the conductor and the ground path in a plane parallel to the plane of the conductor.

The ground path provided in a second plane may be a first ground path. Second and/or third ground paths may be provided in the same plane as the conductor on respective sides of the conductor, separated from the conductor by respective gaps. In such a case, the characteristic impedance of the transmission line along its length may be configured by varying along its length one or more of: the width and/or thickness of the conductor; the relative dielectric constant of the dielectric substrate; the thickness of the dielectric substrate or the distance between the conductor and the ground path in a plane parallel to the plane of the conductor; and the width of one or both of the gaps between the conductor and the second and third ground paths.

The width of one or both of said gaps and/or said distance may decrease along the length of the transmission line from the first end to the second end. A combination of those widths and that distance may decrease along the length of the transmission line from the first end to the second end.

The conductor may comprise a plurality of subsections connected together in series, optionally with gaps between those subsections, optionally with different such subsections occupying different layers of an IC chip, and optionally with each individual subsection having uniform characteristic impedance along its length.

The conductor may comprise a plurality of subsections connected together in parallel, optionally with gaps between those subsections, and optionally with mutually parallel subsections occupying different layers of an IC chip.

The transmission line may be a stripline or microstrip transmission line. For example, the conductor may be located on an upper surface of a dielectric substrate, or buried within such a substrate.

The first and second ends of the transmission line may be respective input and output terminals of the transmission line.

According to a second aspect of the present invention there is provided a resistive circuit, comprising: a transmission line according to the aforementioned first aspect of the present invention; and a resistor, wherein the resistor is connected in series with the transmission line at the second end of the transmission line. Such a circuit may be connected to an output terminal which needs to be terminated, as a termination circuit. For example, such a circuit may be connected between an output terminal and a ground supply, with the first end of the transmission line connected to the output terminal and the resistor connected to the ground supply.

The resistor may have a resistance value substantially equal to (or within a given range of) the characteristic impedance at the second end of the transmission line. Such a range may be ±20%, or ±10% or smaller. The resistor may be a polysilicon resistor.

According to a third aspect of the present invention there is provided an IC chip, comprising a transmission line according to the aforementioned first aspect of the present invention, or a resistive circuit according to the aforementioned second aspect of the present invention.

According to a fourth aspect of the present invention there is provided an IC package, comprising: an IC chip; a substrate on which the IC chip is mounted; and a resistive circuit according to the aforementioned second aspect of the present invention, wherein the resistive circuit is formed on one of the IC chip and the substrate, or distributed between them.

According to a fifth aspect of the present invention there is provided an IC package system, comprising: an IC chip; a substrate on which the IC chip is mounted; a circuit board on which the substrate is mounted; and a resistive circuit according to the aforementioned second aspect of the present invention, wherein the resistive circuit is formed on one of the IC chip, the substrate and the circuit board, or distributed between two or more of them.

An IC chip according to the aforementioned third aspect of the present invention, or an IC package according to the aforementioned fourth aspect of the present invention, or an IC package system according to the aforementioned fifth aspect of the present invention, may comprise a functional block having an output terminal, wherein the resistive circuit is connected to the output terminal as a termination circuit, and optionally wherein the functional block is a digital-to-analogue converter.

Reference will now be made by way of example to the accompanying drawings, of which:

DETAILED DESCRIPTION OF EMBODIMENTS

Figure 2:
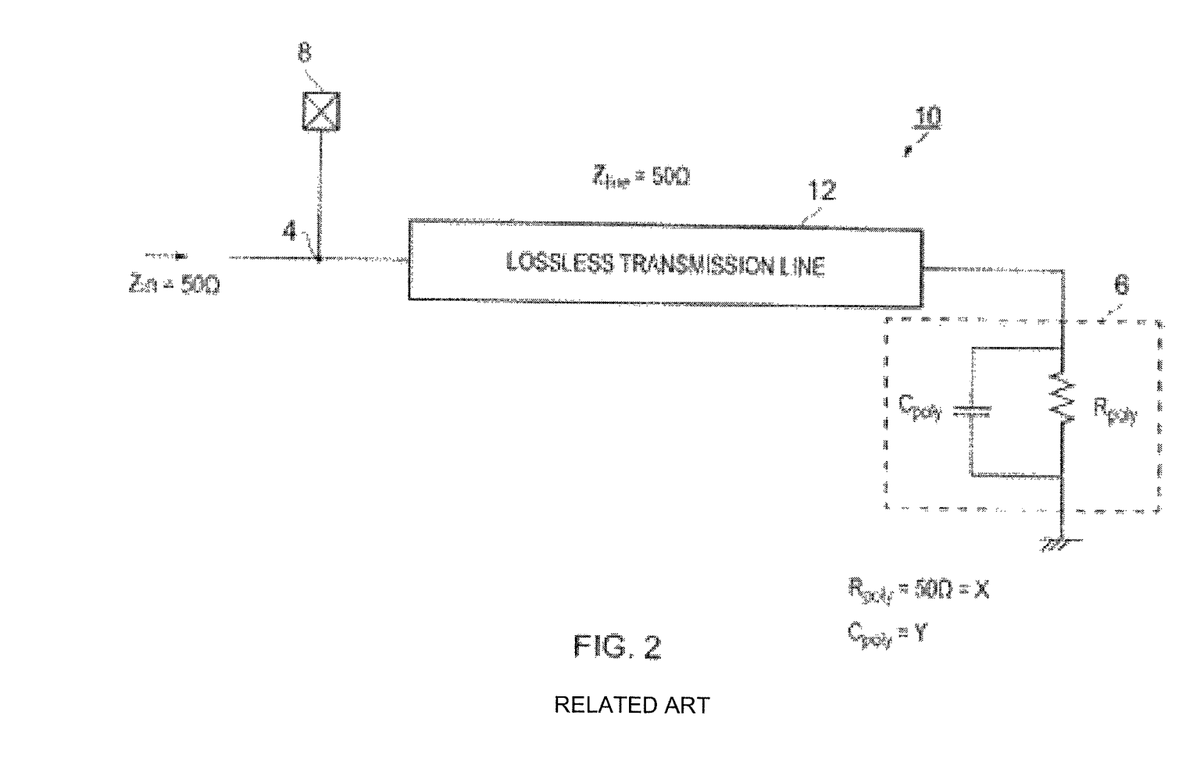
FIG. 2 is a schematic diagram of an example resistance circuit comprising a lossless transmission line which might replace the termination resistors in FIG. 1.

FIG. 2 is a schematic diagram of a resistance circuit 10 which might replace the termination resistors 6 in FIG. 1. For ease of comparison an output 4 and its output terminal or pin 8 (as well as a ground supply) are included in FIG. 2, in line with FIG. 1.

FIG. 2 indicates that the present inventors have considered that a 50Ω termination resistor 6 as in FIG. 1 could be implemented as resistance circuit 10 having a 50Ω "lossless" transmission line 12 (i.e. with $Z_{line}$=50Ω, but with negligible series resistance) in series with a 50Ω termination resistor 6 as in FIG. 1, i.e. implemented in undoped polysilicon. The input impedance $Z_{IN}$ of the resistance circuit 10 as seen by the DAC 2 of FIG. 1 (or some other circuit with such an output 4) is 50Ω as indicated.

The termination resistor 6 is shown as having a resistance $R_{poly}$ and a parasitic capacitance $C_{poly}$. For ease of comparison with FIG. 1 and further description below, $R_{poly}$ is assumed to have value X=50Ω and $C_{poly}$ is assumed to have value Y.

In resistance circuit 10, the transmission line 12 is implemented in metal and configured (e.g. by being very wide and/or thick) to have an ideal zero, or at least very small or negligible, resistance. Moreover, the transmission line 12 could be taken as having no parasitic capacitance, given that it is a transmission line and capacitances and inductances are accounted for as defining the transmission line impedance, since characteristic impedance Z=sqrt (L/C).

An advantage of metal as in transmission line 12 over polysilicon as in termination resistor 6 is that there is a lower 3σ tolerance over process, of around ±10%. However, in resistance circuit 10 there still remains the problem of the 50Ω polysilicon termination resistor 6 which is essentially the same (and thus has the same problems) as the termination resistor 6 of FIG. 1.

Embodiments of the present invention will now be considered. Such embodiments include and comprise lossy transmission lines, in particular "tapered impedance" lossy transmission lines whose characteristic impedance drops along the line from its input terminal to its output terminal. It is recalled that characteristic impedance Z=sqrt(L/C), where L is the inductance of the line per unit length and C is the capacitance of the line per unit length. Thus, a transmission line may be considered to have a characteristic impedance at a particular point (which is effectively a very short—infinitely so—section of the line). Thus, the characteristic impedance at a point along a line may be considered a "local" characteristic impedance, or an effective input impedance as if the line were broken at that point.

Transmission lines according to the present invention are "lossy" in that they have significant series resistance (which is avoided in 'normal' lossless transmission lines). For example, such lines may be configured such that at least half of incident energy provided at their input terminals (by way of input electrical signals) is absorbed or dissipated (as heat) along their length.

For example, the characteristic impedance at the output terminal (second end) of such a transmission line may be S times the characteristic impedance at the input terminal (first end) or smaller, where S is 0.9, or preferably 0.7, or more preferably 0.5, or more preferably 0.2. Moreover, the series resistance of the transmission line may be substantially equal to (or within a range of) the difference between the characteristic impedance at the output terminal (second end) and the characteristic impedance at the input terminal (first end). The range may be ±20%, or ±10% or ±5%.

A lossy electrical-signal transmission line according to the present invention may be considered to have first and second ends, the transmission line being configured such that its characteristic impedance at the first end has a first value; its characteristic impedance at the second end has a second value, lower than the first value; and its series resistance measured from its first end to its second end is within a given range of the difference between said first and second values. Such transmission lines will be referred to herein as lossy tapered-impedance transmission lines. Such transmission lines may be described as "matched-loss" transmission lines.

Figure 3:
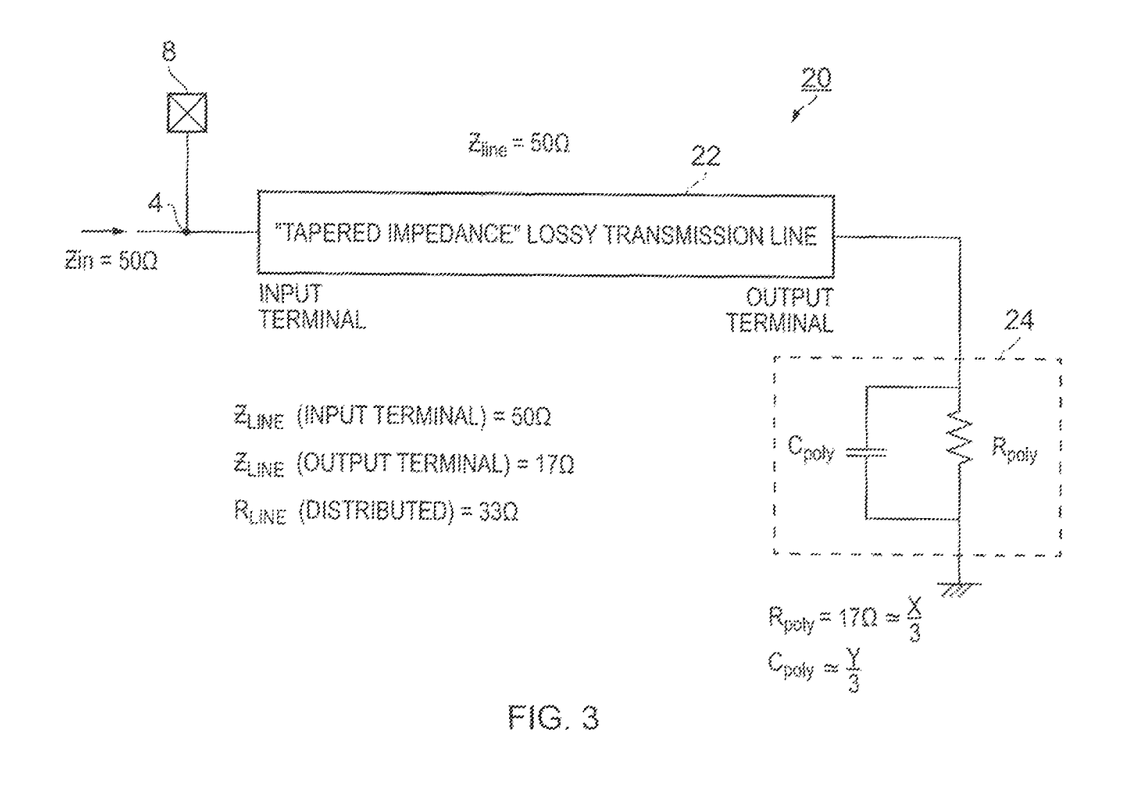
FIG. 3 is a schematic diagram of a resistance circuit comprising a lossy tapered-impedance transmission line embodying the present invention, which might replace the termination resistors in FIG. 1.

FIG. 3 is a schematic diagram of a resistance/resistive circuit 20 embodying the present invention, which might replace the 50Ω termination resistors 6 in FIG. 1. For ease of comparison an output 4 and its output terminal or pin 8 (and a ground supply) are included in FIG. 3, in line with FIG. 1.

FIG. 3 indicates that a 50Ω termination resistor 6 as in FIG. 1 could be implemented as a resistance circuit 20 comprising a lossy tapered-impedance transmission line 22 connected in series with a polysilicon termination resistor 24 smaller in value than termination resistor 6. The input impedance $Z_{IN}$ of the resistance circuit 20 as seen by the DAC 2 of FIG. 1 (or some other circuit with such an output 4) is configured to be 50Ω by way of example, for consistency with FIGS. 1 and 2. Of course, the input impedance value could be set to a desired value.

The lossy tapered-impedance transmission line 22, itself embodying the present invention, is considered to have an input terminal at one of its ends (first end) and an output terminal at the other one of its ends (second end), as indicated. Further, the transmission line 22 is configured to have an impedance looking in $Z_{LINE}$ (at its input terminal) of 50Ω in line with the desired $Z_{IN}$ of 50Ω, but with that impedance value dropping away along its length towards its output terminal. In the example case in FIG. 3, the characteristic impedance of the line drops down to 17Ω at its output terminal. This is indicated in FIG. 3 as $Z_{LINE}$ (input terminal) of 50Ω and $Z_{LINE}$ (output terminal) of 17Ω.

As an aside, the transmission line 22 might be drawn as getting narrower along its length from input terminal to output terminal, to indicate the dropping impedance schematically. However, it is to be noted that lower impedance generally requires (other things being equal) the conductor of the line (which carries the signal) to be physically wider. As such, the transmission line 22 could equally be drawn as getting wider along its length, to indicate schematically how the dropping impedance might be achieved physically by varying the width of the conductor.

As noted above, the tapered-impedance transmission line 22 is specifically designed to be lossy. It is in fact desirable (in a practical embodiment) to configure the line to be as lossy as possible (which is unusual in the context of transmission lines), so that it can be as short as possible, dissipate a large proportion of the energy incident at its input, and consume for example minimum chip area.

The series resistance (loss) of the transmission line 22 is chosen (along with the design of aspects of the line which affect its characteristic impedance along its length) such that the resistance from the input terminal to any point along the line approximately equals the drop in the characteristic impedance up to that point.

In FIG. 3, therefore, the total series resistance of the line $R_{LINE}$ (distributed) is indicated as being 33Ω. As such, the transmission line 22 may be considered itself to act as a resistor or resistance, and the polysilicon termination resistor 24 may have a smaller resistance value than resistor 6 since the line 22 and resistor 24 in series take the place of the resistor 6 in FIG. 1. Thus, in the present example where $R_{LINE}$ (distributed) is 33Ω, the resistance of the polysilicon termination resistor 24 $R_{poly}$ is 17Ω, which is approximately equal to X/3 (see FIG. 2). The width of the resistor may be set by the current rating which is unchanged in the present example, but the resistor length will be reduced by approximately 3× and so will the resistor area. Consequently, the parasitic capacitance $C_{poly}$ of the polysilicon termination resistor 24 is approximately equal to Y/3 (see FIG. 2). This allows $R_{poly}$ and $C_{poly}$ in FIG. 3 to drop to around a third of the values in FIG. 2, and the relative advantages are discussed below.

In some embodiments it may be that the characteristic impedance of the line drops down to lower than 17Ω at its output terminal (e.g. down to 5Ω or even just a few ohms), although this may require the transmission line to be rather long. An advantage however would be having an even smaller value for resistor 24, potentially down to a few or even 0 ohms (i.e. not needing the resistor) in some applications.

Figure 4:
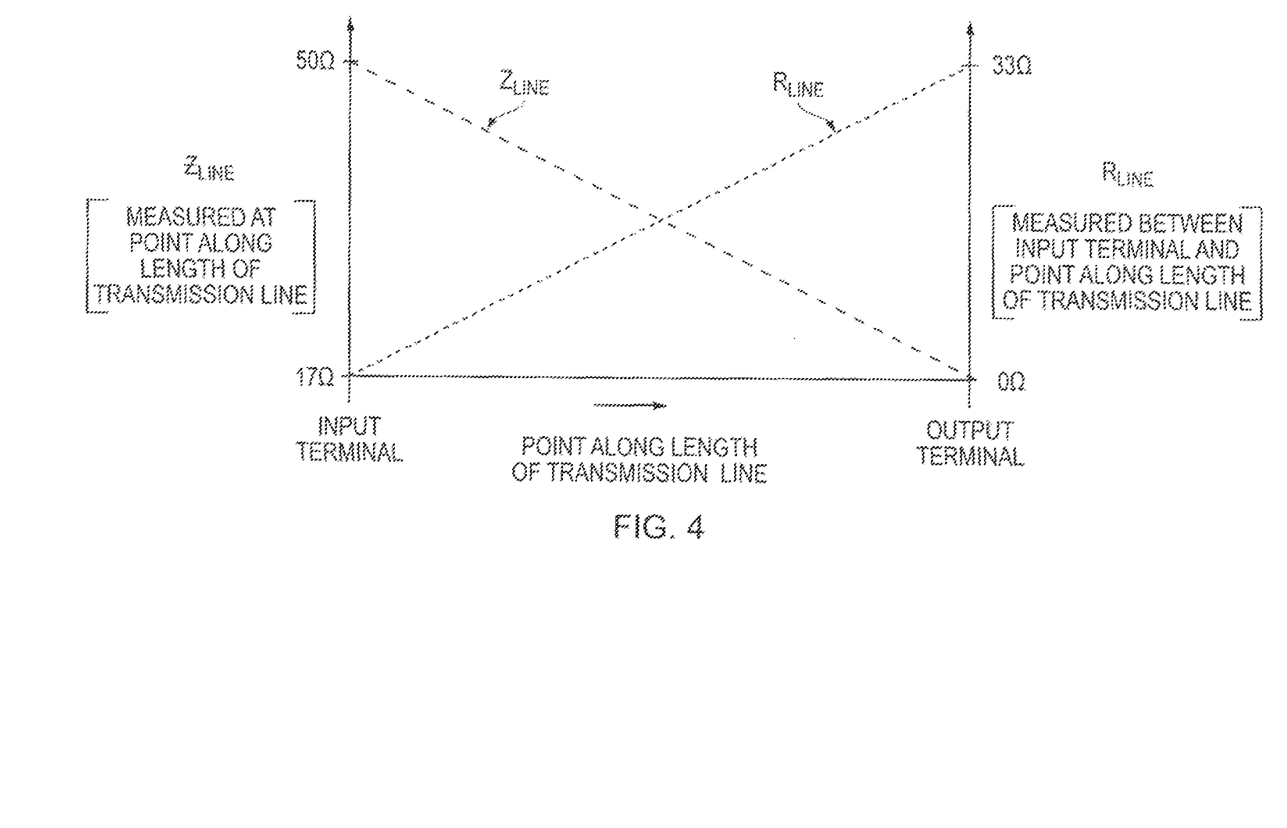
FIG. 4 is a graph indicating one example of how the characteristic impedance and series resistance at a point along the length of the transmission line of FIG. 3 may vary as the point is moved along its length.

FIG. 4 is a graph indicating how the characteristic impedance of the line $Z_{LINE}$ may vary along the length of the line from its input terminal to its output terminal, in the present example dropping from 50Ω down to 17Ω. Also indicated is how the series resistance measured from the input terminal to a point along the line increases as that point moves from the input terminal to the output terminal, in the present example increasing from 0Ω to 33Ω.

It is noted that the drop in impedance along the line 33Ω (50Ω down to 17Ω) is approximately equal to the distributed resistance of the line of 33Ω. The same is true of any point along the line—i.e. at any point along the line the distributed resistance from the input terminal to that point is approximately equal to the drop in effective input impedance from the input terminal to that point.

It is noted that although FIG. 4 may represent an ideal case, where at any point along the line the distributed resistance from the input terminal to that point is equal to the drop in effective input impedance from the input terminal to that point, practical embodiments may approximate (as closely as possible, taking into account other design requirements) this ideal case. For example, at any point along the line the distributed resistance from the input terminal to that point may be close to (e.g. within a range of) the drop in effective input impedance from the input terminal to that point.

Further, although the traces on the graph of FIG. 4 are linear, this is not essential. Any curve is possible (e.g. stepped, exponential, etc.). For example, the impedance values could have a stepped profile (achieved by stepped changes to the configuration of the transmission line along its length) rather than a continuous profile as in FIG. 4. The resistance values may nevertheless have a linear profile as shown, the linear resistance and stepped impedance profiles together being one example of how a practical embodiment may seek to closely approximate the ideal case mentioned above.

Incidentally, something other than linear may give (for example) smaller area for a given $Z_{IN}/Z_{OUT}$ impedance ratio. However, if the transmission line width (i.e. that of the conductor) is kept constant, e.g. just wide enough to carry the output current of the circuit (e.g. DAC) having output 4, and the impedance change is effected by altering the spacing to the ground return paths of the transmission line rather than the width or thickness of the conductor (see FIGS. 6 and 7 below), the resistance per unit length will be constant (given uniform conductor material) so the resistance drop will be linear.

It will be appreciated that the ideal case mentioned above is one in which signal reflections would be non-existent or minimal, given perfect matching with resistor 24, and that the more significant the departure from the ideal case the more significant would be the problem of signal reflections.

One point to note is that although the tapered-impedance property of the transmission line of FIG. 3 could be achieved by varying the width of the line itself (i.e. of the conductor—as mentioned above), it could also be achieved by varying the gap to GND along its length as mentioned below (see FIGS. 6 and 7). As such, it may indeed be better to keep the physical width of the line itself constant, with the desired distributed resistance property in mind, and instead vary the size of such gaps. In this case, the width of the line would be made constant and just wide enough to carry the DAC output current—this will minimise the length of the line and the area occupied by it.

Figure 5A:
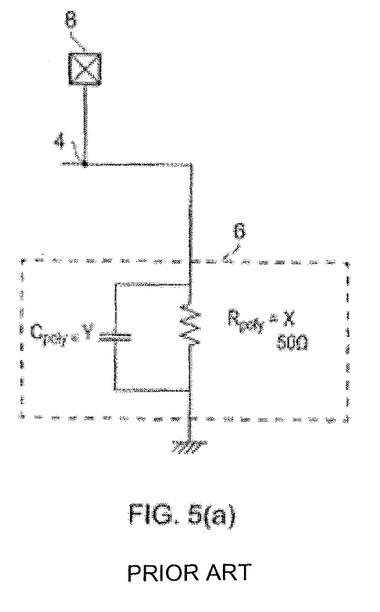
FIGS. 5(a) of the prior art and 5(b) present equivalent circuits of the 'traditional' polysilicon resistor of FIG. 1 and the resistance circuit of FIG. 3, respectively, for comparison.
Figure 5B:
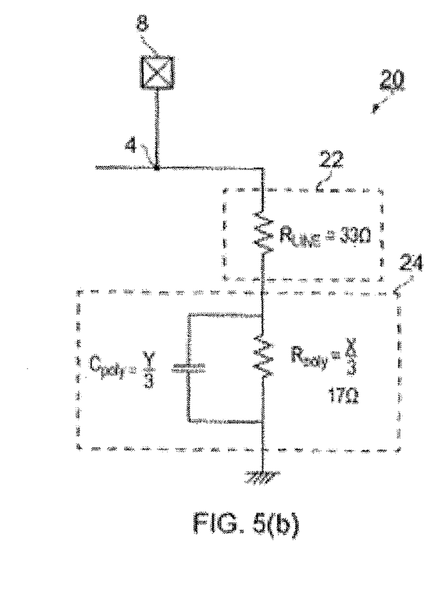

Advantages of the resistance circuit 20 can be appreciated by comparing FIG. 5(a) with FIG. 5(b). In FIG. 5(a), the 'traditional' polysilicon resistor 6 is shown acting alone as a termination circuit directly connected to the output terminal 4. Continuing the running example, $R_{poly}$ is assumed to have value X=50Ω and $C_{poly}$ is assumed to have value Y.

FIG. 5(b), in contrast, presents an effective circuit corresponding to the resistance circuit 20. The metal tapered-impedance transmission line 22 is shown as an effective resistance (having no parasitic capacitance) and is series connected with the polysilicon resistor 24 (having its parasitic capacitance).

With the example numbers given in FIGS. 3 and 4, i.e. with X=50Ω, the resistance of the polysilicon termination resistor 24 $R_{poly}$ is 17Ω, which is approximately equal to X/3 as before. Similarly, the parasitic capacitance $C_{poly}$ of the polysilicon termination resistor 24 is approximately equal to Y/3. The resistance $R_{LINE}$ of the transmission line 22 is in this case 33Ω. With these reductions in $R_{poly}$ and $C_{poly}$, the resistance circuit 20 as shown in FIG. 5(*b*) may be considered to provide around 30 times improvement in performance (as compared to plain use of the termination resistor 6 as in FIG. 5(*a*)).

By way of explanation, the polysilicon parasitic capacitance $C_{poly}$ is approximately 3× smaller and in parallel with a resistance $R_{poly}$ which is also approximately 3× smaller, so the RC time constant (the area under this is what affects $S_{11}$) is approximately 9× smaller. Then, this is separated from the output 4 by a resistance $R_{LINE}$ which is approximately 2× as large as $R_{poly}$ so only approximately ⅓ of the output voltage appearing at output 4 appears across the polysilicon resistor 24. Thus, the error due to reflections seen at the input due to the parasitic capacitance of the undoped-polysilicon resistor 24 is approximately 27× smaller than for plain use of the termination resistor 6 as in FIG. 5(*a*), i.e. giving approximately 30 times improvement. Of course, the degree of such improvement depends on the values and configuration of circuitry elements in any given embodiment.

Figure 6:
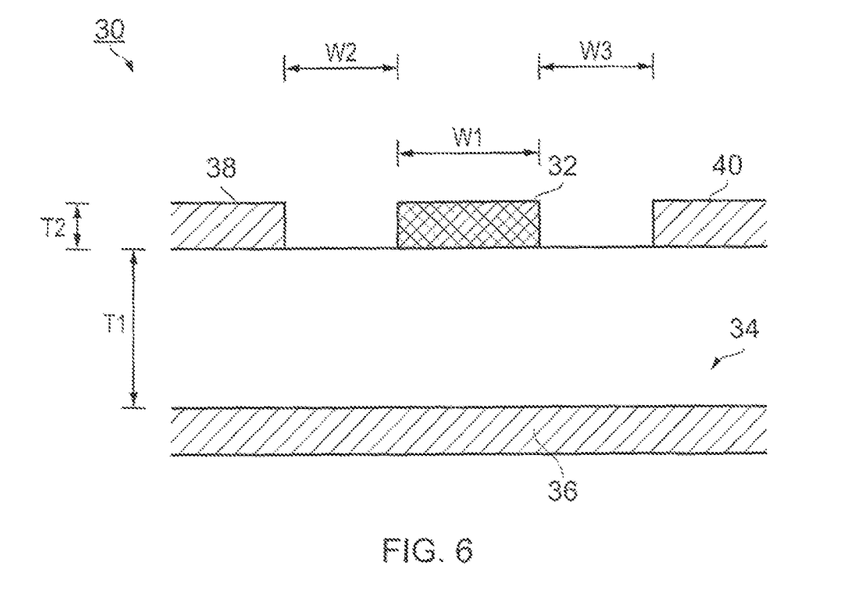
FIG. 6 is a schematic diagram representing an example cross-sectional view of a lossy tapered-impedance transmission line according to the present invention.
Figure 7A:
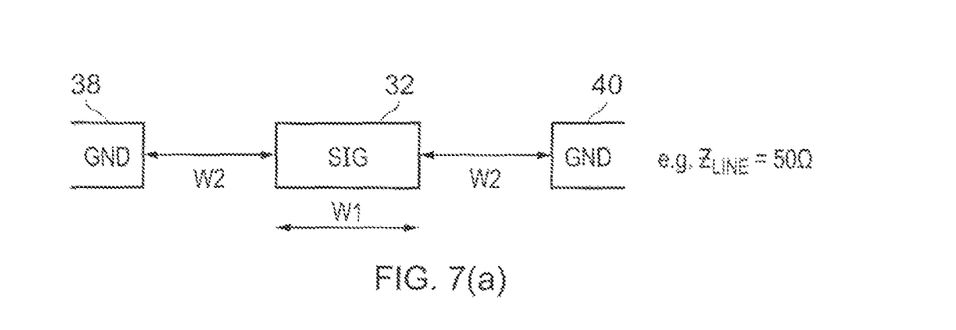
FIGS. 7(a) and 7(b) are schematic diagrams showing parts of the transmission line of FIG. 6 to indicate that the "tapered" impedance nature need not be created by varying the width of its conductor.
Figure 7B:
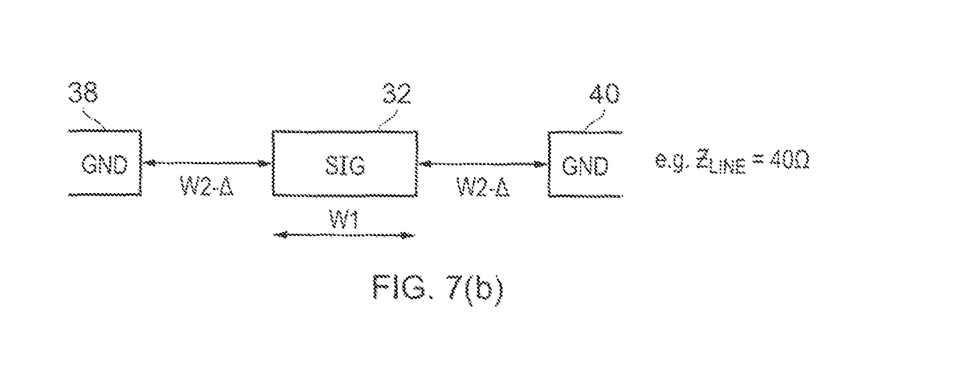

FIG. 6 is a schematic diagram representing an example cross-sectional view of a tapered-impedance lossy transmission line 30 according to the present invention. As such, tapered-impedance transmission line 30 corresponds to tapered-impedance transmission line 22.

Tapered-impedance transmission line 30 comprises a main conductor 32, which is in the form of a strip (and as such has a generally rectangular cross-section as shown). The conductor is provided on one surface of a dielectric substrate 34, and a ground path or plane 36 is provided on the opposite surface of that dielectric substrate. Further ground paths, planes or strips 38, 40 are provided on the same surface as the conductor 32 and on either side thereof. It will be appreciated that this general arrangement may be implemented in integrated circuitry, e.g. on an IC chip.

The conductor 32 is for carrying a desired signal, and is in effect the part of the line which would (in the context of transmission line 22) be connected to the output 4 above, and the part of the line which would be connected to the polysilicon resistor 24. Thus, the input terminal at one end of the line is between the conductor and ground, and the output terminal at the other end of the line is also between the conductor and ground. The ground planes or strips 38, 40 on the same layer as the conductor 32 would be linked to the ground plane 36 by vias (not shown)—this structure may be referred to as a coplanar-over-ground transmission line.

Thus, considerations above relating to the possible shape (e.g. width) and materials of the transmission line 22 relate mainly to the conductor thereof (as mentioned above), i.e. conductor 32 in FIG. 6. For example, the series resistance of the transmission line 30 may be configured by choice of material and dimensions of the conductor 32 along its length.

Further, the impedance value (effective input impedance, or characteristic impedance) of the transmission line 30 relate to the dimensions of the conductor 32 and to the relative arrangement/dimensions/materials of the ground planes (paths) 36, 38, 40 and the dielectric substrate 34 which interact with the conductor 32.

With this in mind, consider the following parameter values. In FIG. 6, the conductor 32 is separated from ground plane 36 by a dielectric substrate 34 having a thickness T1 (also representing a distance from the conductor 32 to the ground plane 36). The conductor itself has a width W1 and thickness T2, defining its cross-sectional area. The ground planes or strips 38 and 40 are separated from the conductor 32 by gaps having respective widths W2 and W3.

The conductor 32 and ground planes 36, 38, 40 may be made of the same material (e.g. a metal such as copper or aluminium) or of different materials (metals). For example, the conductor may have an electrical resistivity at the shown cross-section of ρ1, and the ground planes may have an electrical resistivity at the shown cross-section of ρ2. The dielectric substrate 36 may have a relative dielectric constant of $\epsilon_r$.

It is noted that FIG. 6 represents a single cross-section of the transmission line 30 which may have length L, and that the above parameter values may vary along the length L. For example, the ground planes (paths) 36, 38, 40 and the conductor 32 may take up more than one layer in various places along length L (e.g. with parallel sections), and/or may move from one layer to another along length L. Together, the parameter values may be set along the length L in order to provide transmission line 30 with the desired tapered-impedance and lossy property.

In a typical embodiment all of the above parameter values might be constant along the transmission line, except for the values W2 and W3 (and perhaps T1, in the sense of the distance from the conductor 32 to the ground plane 36), which may (each or in combination) be reduced along the line from input terminal to output terminal to cause the effective input impedance to reduce along the line. Advantageously, by having constant W1, T2 and ρ1 along the line (i.e. by having a uniform strip as the conductor 32), the series resistance may increase linearly along the line in line with FIG. 4.

Typical (i.e. example) values/ranges for the above parameters may be:

W1=3 μm (constant from input to output)
  Depending on the current-carrying capacity of metal and the output current of the circuit without output 4, e.g. a DAC. For example, if average current is 24 mA and capacity is 8 mA/μm (typical for thick metal in upper layers), W1=3μm.
W2=from 3 μm to 0.5 μm along the line (input to output)
W3=from 3 μm to 0.5 μm along the line (input to output)
T2=1 μm (constant from input to output)
T1=in from 3 μm to 1 μm along the line (input to output)
  Achieved e.g. by changing which metal layer is used for GND plane 36
L=3000 μm
ρ1=0.03 ohms/square (constant from input to output)
ρ2=0.03 ohms/square (constant from input to output)
Material of the conductor=copper (constant from input to output)
Material of the ground planes=copper (constant from input to output)

FIGS. 7(*a*) and 7(*b*) show parts of transmission line 30, specifically conductor 32 (carrying the signal) and ground planes or strips 38 and 40, and are to indicate that the "tapered" impedance nature of the transmission line 30 need not be created by varying the width W1 of its conductor. For example, the physical gap between the conductor 30 and the ground supply (GND) at ground planes 38 and 40 (and 36) could be varied instead.

In FIG. 7(*b*) as compared to FIG. 7(*a*) the width W1 of conductor 32 is unchanged as compared to FIG. 7(*a*), however the gaps to the ground planes or strips 38 and 40 have been reduced, with a consequential drop in the effective input impedance $Z_{LINE}$.

As above, the height to the underlying GND plane 36 shown in FIG. 6 could be changed by altering which metal layer is used for this GND plane, to affect impedance. For example, if the conductor 32 is formed in metal layer 10 of an IC chip, the underlying GND plane 36 could be formed in metal layer 9 or 8 or 7, etc. Increasing this spacing gives higher impedance, and vice versa. If this is done, at the point where the underlying GND plane changes metal layer there would be a step change in impedance; this can be compensated for by also changing the spacings/gaps W2 and W3 the coplanar GND tracks 38, 40 at the same point. Effectively, the spacing between all of the ground planes/paths in combination and the conductor affects the impedance value.

Of course, a combination of varying the transmission line (conductor) dimensions and the gaps along its length could be employed. Moreover, the "impedance tapering" need not be truly continuous as already mentioned; a stepped profile (in the width and/or the gaps) could be adopted. In practice, any taper in shape will typically be stepped in some small increments because lithography rules typically only allow edges at 0 and 90 degrees (and sometimes 45 degrees).

Figure 8A:
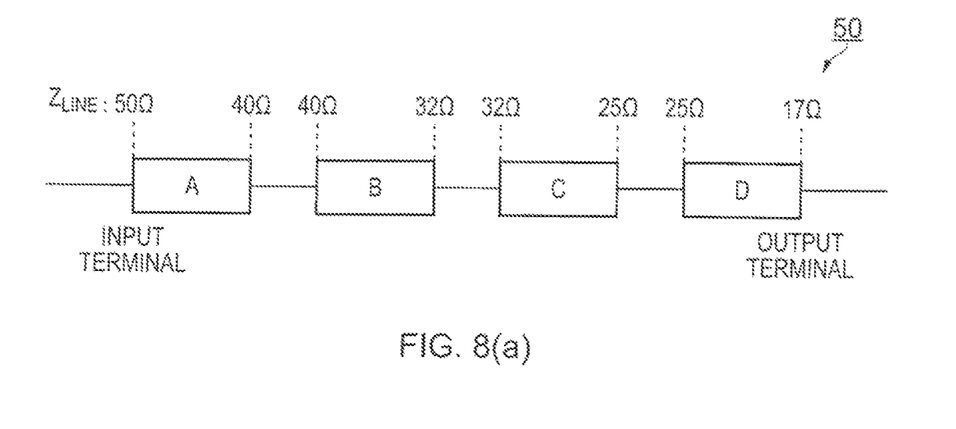
FIGS. 8(a) and 8(b) are schematic diagrams that indicates that a lossy tapered-impedance transmission line of the present invention need not be one continuous line.

FIG. 8 is a schematic diagram that indicates that a lossy tapered-impedance transmission line of the present invention need not be one continuous line, and the present disclosure and the invention will be understood accordingly. As in the transmission line 50 of FIG. 8(*a*), it could comprise a plurality of series-connected segments or sub-sections (connected by normal signal-line tracking or vias), here labelled A to D for convenience. Example characteristic impedance values $Z_{LINE}$ are indicated for the beginning and end of each such segment, in line with transmission line 22 described above.

One point to note is that in FIG. 8(*a*) each individual segment could be configured to have constant or uniform characteristic impedance along its length, but with each successive segment from A to D having a lower characteristic impedance than the previous one. This may be one practical way to approximate the ideal case mentioned above. For example, by having a higher number of such segments with finer differences in characteristic impedance between them, the closer the overall transmission line will approximate the ideal case. By having a lower number of such segments with larger differences in characteristic impedance between them, the further away from the ideal case the overall transmission line will be (and the worse will be the problem of signal reflections).

Figure 8B:
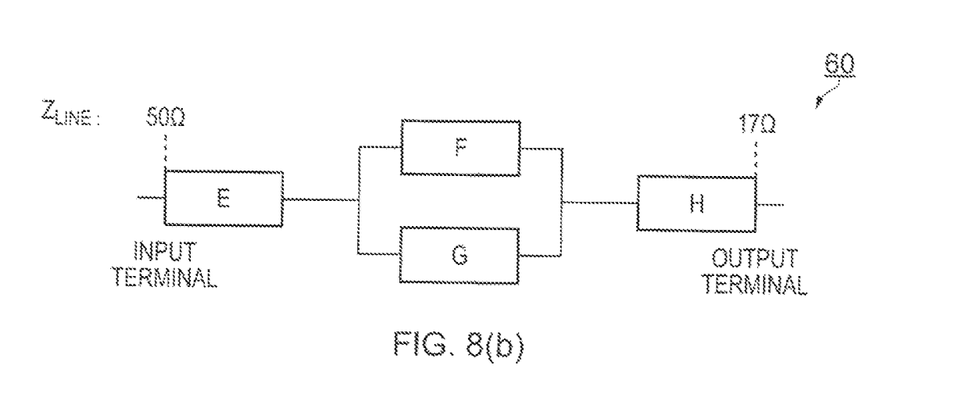

As in the transmission line 60 of FIG. 8(*b*), such a line could also comprise a plurality of series- and/or parallel-connected segments or sub-sections, here labelled E to H for convenience. Example effective input impedance values $Z_{LINE}$ are indicated for input and output terminals, in line with transmission line 22 described above.

Any combination of series- or parallel-connected segments could be employed, for example utilising multiple parallel metal layers in an IC chip. A transmission line in accordance with the present invention may indeed be made from more than one layer of metal (e.g. 2 or 3 layers) to further reduce variation in resistance. For example, if the resistance variations of each metal lever are uncorrelated and are 10% each, the total metal resistance will have 7% variation.

It is noted that each such segment would have its own series (distributed) resistance, and as such these resistances (in series/parallel arrangements) would need to be taken into account along with the desired tapered-impedance property when designing the line configuration.

It is estimated that the transmission line 22 in the example of FIG. 3 (50Ω impedance down to 17Ω) would need to be around 2.75 mm long. For example, at 0.03Ω/□, 33Ω would amount to 1100□, i.e. w=2.5 μm and l=2750 μm. This would be acceptable given 8 mA/μm width metal current capability and 20 mA average output current at each terminal. In the context of semiconductor layouts for high-speed DAC circuitry, a 2.75 mm transmission line is very long and as such if need not be implemented in a straight line.

Figure 9:
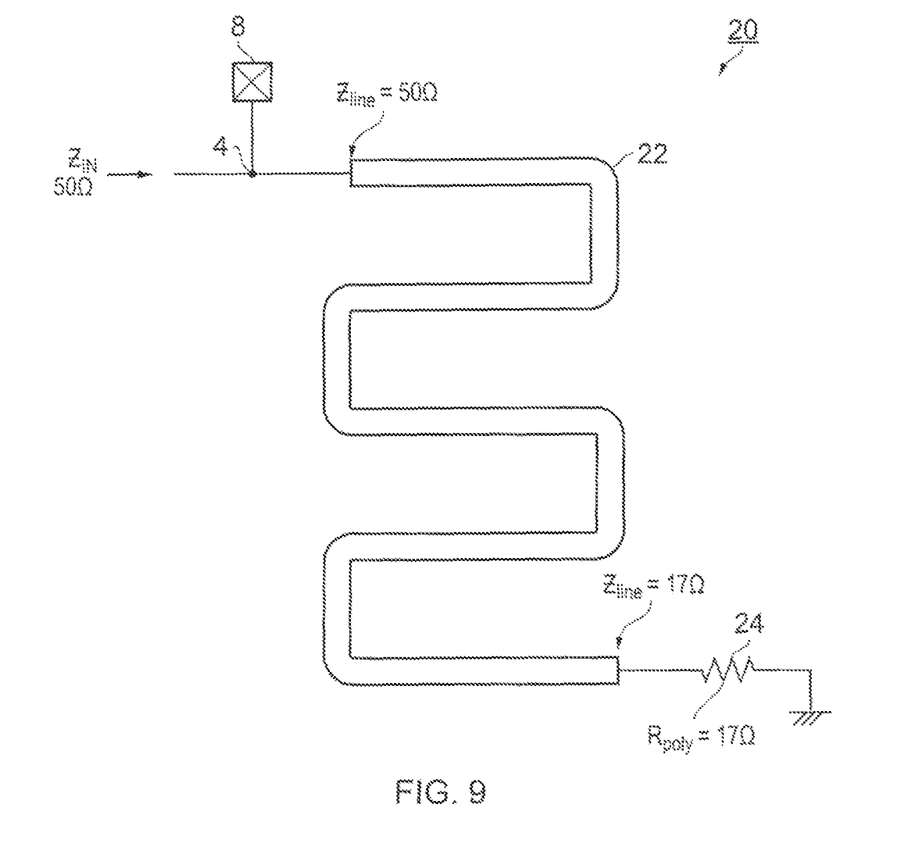
FIG. 9 is a schematic diagram that indicates that a lossy tapered-impedance transmission line of the present invention need not be a straight line.

As shown in FIG. 9, transmission line 22 of resistance circuit 20 need not be a straight line—it could be implemented in a snaked form. Of course, any combination of straight and curved sections could be employed in practice. In such a snaked form, the parallel straight parts could be segments of the transmission line as in FIG. 8(*a*), with those segments simply being connected together in series. This may be a practical embodiment, and indeed each such segment may itself have uniform characteristic impedance as mentioned above (giving a stepped impedance profile along the line).

Transmission lines according to the present invention may be considered microstrip or stripline transmission lines. They may be considered as a coplanar waveguide with ground. Thus, the arrangement in FIG. 6 is simply one example arrangement.

A stripline circuit uses a flat strip of metal which is sandwiched in a substrate between two parallel ground planes. The insulating material of the substrate forms a dielectric. The width of the strip, the thickness of the substrate and the relative permittivity of the substrate determine the characteristic impedance of the strip which is a transmission line. The central conductor need not be equally spaced between the ground planes. In the general case, the dielectric material may be different above and below the central conductor.

Incidentally, it will be appreciated that integrated circuitry may be provided in the form of an IC chip. Such an IC chip may be mounted on a substrate to form an IC package. Such an IC package may be mounted on a circuit board to form an IC package system.

With this in mind, it is to be noted that resistance or resistive circuits of the present invention (comprising a transmission line and a termination resistor in series, as in FIG. 3) may be flexibly implemented. For example, the entire resistive circuit could be implemented on such an IC chip, or such a substrate, or such a circuit board. As another example, the transmission line could be implemented on an IC chip, and the termination resistor could be implemented on a substrate on which that chip is mounted. As another example, the transmission line could be implemented on a substrate on which an IC chip is mounted, and the termination resistor could be implemented on a circuit board on which that substrate is mounted. As yet another example, the transmission line could be implemented on an IC chip, the chip could be mounted on a substrate, and the termination resistor could be implemented on a circuit board on which that substrate is mounted. In each of these cases, the chip, substrate and circuit board (as applicable) could be provided separately, for example to be assembled later.

The definition of transmission line impedance is $Z=\text{sqrt}(L/C)$, and the velocity of propagation down the line is $1/\text{sqrt}(L/C)$. So for a given impedance it is desirable to control the ratio L/C, both of which are per unit length and depend on the dimensions and dielectric materials. For example, tor microstrip a 50 ohm conductor line on typical dielectric material has e.g. W/H=2, for buried stripline e.g. W/H=1. Since the length L of the line may also be proportional to VV (constant number of squares) the area may be proportional to $W^2$, so to minimise area it may be desirable for W to be as small as possible—in practice, just wide enough to carry the current.

Transmission lines and resistive circuits of the present invention may also be applied in radio-frequency or high-frequency circuits where it is desirable to have an accurate resistor with minimum parasitic capacitance, especially circuits where the current is relatively high (e.g. 10 mA or more) so that a conventional resistor would have to have a large area (large parasitic capacitance) to carry the current.

Circuitry of the present invention may from part of a digital-to-analogue converter (e.g. in the sense of being provided at its outputs). Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the scope of the appended claims.

The invention claimed is:

1. A resistive circuit comprising a transmission line and a resistor, wherein:
   the transmission line comprises a lossy electrical-signal transmission line having first and second ends;
   the transmission line is configured such that characteristic impedance at the first end of the transmission line has a first value, characteristic impedance at the second end of the transmission line has a second value, the second value being lower than the first value, and a series resistance of the transmission line measured from the first end to the second end of the transmission line is within a given range of the difference between said first and second values;
   the first and second ends of the transmission line are ports of the transmission line, each port comprising a first terminal and a second terminal; and
   the resistor is connected between the first and second terminals at the second end of the transmission line.

2. The resistive circuit as claimed in claim 1, wherein the series resistance measured from the first end to the second end is within Q percent of a difference between said first and second values, where Q is 20 or less.

3. The resistive circuit as claimed in claim 1, wherein the series resistance of the transmission line measured from the first end to each of one or a plurality of points along a length of the transmission line is within a particular range of a drop in characteristic impedance from the characteristic impedance at the first end to the characteristic impedance at that point.

4. The resistive circuit as claimed in claim 3, wherein the series resistance of the transmission line measured from the first end to the or each said point along the length of the transmission line is within R percent of the drop in characteristic impedance from the characteristic impedance at the first end to the characteristic impedance at that point, where R is 20 or less.

5. The resistive circuit as claimed in claim 1, wherein:
   the transmission line comprises a signal conductor and one or more separate ground paths; and
   said series resistance is series resistance of the signal conductor.

6. The resistive circuit as claimed in claim 5, wherein the signal conductor has a substantially constant cross-sectional area along some or all of a length of the signal conductor.

7. The resistive circuit as claimed in claim 5, wherein the characteristic impedance of the transmission line along a length of the transmission line is configured by changing along the length one or more of:
   the width and/or thickness of the signal conductor;
   the width of a gap between the signal conductor and the or each ground path.

8. The resistive circuit as claimed in claim 7, wherein the transmission line comprises a plurality of said separate ground paths, there is a gap having a gap width between each said ground path and the signal conductor, and each said gap width or a combination of said gap widths decreases along the length of the transmission line from the first end to the second end.

9. The resistive circuit as claimed in claim 5, wherein said conductor comprises a plurality of subsections connected together in series and/or parallel.

10. The resistive circuit as claimed in claim 9, wherein the conductor comprises the plurality of subsections with one or more of:
    gaps between those subsections;
    different such subsections occupying different layers of an IC chip;
    mutually parallel subsections occupying different layers of the IC chip; and
    each or at least one individual subsection having uniform characteristic impedance along a length of each or at least one individual subsection.

11. The resistive circuit as claimed in claim 1, wherein said resistor has a resistance value substantially equal to or within a range of the characteristic impedance at the second end of the transmission line.

12. An integrated circuit (IC) package, comprising:
    an IC chip;
    a substrate on which the IC chip is mounted; and
    the resistive circuit as claimed in claim 1,
    wherein the resistive circuit is formed on one of the IC chip and the substrate, or distributed between them.

13. A lossy electrical-signal transmission line having first and second ends, the transmission line being configured such that:
    characteristic impedance of the transmission line at the first end has a first value;
    characteristic impedance of the transmission line at the second end has a second value, the second value being lower than the first value; and
    series resistance of the transmission line measured from the first end to the second end is within a given range of a difference between the first and second values,
    wherein the characteristic impedance of the transmission line drops linearly or in steps along a length of the transmission line from the first end to the second end.

14. The resistive circuit as claimed in claim 1, wherein the second value is S times the first value or smaller, where S is 0.9 or less.

15. A resistive circuit, comprising:
the transmission line as claimed in claim 13; and
a resistor, wherein:
the first and second ends of the transmission line are ports of the transmission line, each port comprising a first terminal and a second terminal; and
the resistor is connected between the first and second terminals at the second end of the transmission line.

16. A lossy electrical-signal transmission line having first and second ends, the transmission line being configured such that:
characteristic impedance of the transmission line at the first end has a first value;
characteristic impedance of the transmission line at the second end has a second value, the second value being lower than the first value; and
series resistance of the transmission line measured from the first end to the second end is within a given range of a difference between the first value and the second value,
wherein the series resistance measured from the first end to the second end is large enough such that a half or more of an energy of a signal input at the first end is dissipated or absorbed in the transmission line.

\* \* \* \* \*